(12) United States Patent
Kinase et al.

(10) Patent No.: US 6,816,708 B1
(45) Date of Patent: Nov. 9, 2004

(54) MEASURING INSTRUMENT WITH MULTIPLE SIGNAL TERMINALS SHARED IN MULTIPLE OPERATION MODES

(75) Inventors: Jun Kinase, Atsugi (JP); Shunichi Sugita, Zama (JP); Yasunori Yamada, Atsugi (JP); Hidekazu Kono, Atsugi (JP)

(73) Assignee: Anritsu Corporation, Tokyo (JP)

( * ) Notice: Subject to any disclaimer, the term of this patent is extended or adjusted under 35 U.S.C. 154(b) by 614 days.

(21) Appl. No.: 09/857,851

(22) PCT Filed: Oct. 24, 2000

(86) PCT No.: PCT/JP00/07435

§ 371 (c)(1),
(2), (4) Date: Jun. 11, 2001

(87) PCT Pub. No.: WO01/31352

PCT Pub. Date: May 3, 2001

(30) Foreign Application Priority Data

Oct. 25, 1999 (JP) .......................................... 11/302397

(51) Int. Cl.[7] .............................................. H04B 17/00
(52) U.S. Cl. ................................ 455/67.11; 455/67.14; 455/423; 455/424; 455/115.1; 455/115.2; 455/226.1
(58) Field of Search .......................... 455/67.11, 67.14, 455/423, 424, 115.1, 115.2, 164.2, 161.3, 226.1, 550.1, 90.3; 345/35; 375/224, 228; 370/247, 241

(56) References Cited

U.S. PATENT DOCUMENTS 5,425,076 A * 6/1995 Knippelmier ............ 379/27.04
5,452,320 A * 9/1995 Kim et al. .................. 375/224
5,521,904 A * 5/1996 Eriksson et al. ............ 370/249
5,572,510 A * 11/1996 Koivu ........................ 370/252
5,686,903 A * 11/1997 Duckworth et al. ... 340/825.22
5,913,153 A * 6/1999 Nakamoto et al. ............ 455/78
5,943,617 A * 8/1999 Nakamura .................. 455/423
6,052,565 A * 4/2000 Ishikura et al. .......... 455/67.11

FOREIGN PATENT DOCUMENTS

| EP | 0 971 237 A2 | 1/2000 |
| JP | 59-92357 | 5/1984 |
| JP | 4-291164 | 10/1992 |
| JP | 7-162379 | 6/1995 |
| JP | 9-321717 | 12/1997 |

* cited by examiner

Primary Examiner—Marceau Milord
(74) Attorney, Agent, or Firm—Frishauf, Holtz, Goodman & Chick, P.C.

(57) ABSTRACT

A housing 1 contains a plurality of signal processing units for performing signal processing corresponding to a plurality of operation modes. At a front surface 1a of the housing, an operation panel 3, a display, and a plurality of signal terminals 5a are provided, the signal terminals being located close to the display and shared by the signal processing units. A signal name memory stores signal names 11 allocated to the respective signal terminals for each of the signal processing units. A changeover switch is switched such that the signal processing units are connected to the signal processing unit corresponding to the designated operation mode in response to the operation-input operation mode designation, and the signal name corresponding to the designated operation mode is read out from the signal name memory, and is then displayed in the vicinity of the corresponding signal terminal on a display screen 4a of the display.

10 Claims, 7 Drawing Sheets

| TERMINAL NUMBER | CDMA MODULATION | TDMA MODULATION | ---- | ARBITRARY WAVEFORM |
|---|---|---|---|---|
| 1 | SYNCHRONI-ZATION | | | |
| 2 | 11 | | | |
| 3 | | | | |
| ⋮ | | | | |
| N | | | | |

31
31a

MEASURING INSTRUMENT WITH MULTIPLE SIGNAL TERMINALS SHARED IN MULTIPLE OPERATION MODES

TECHNICAL FIELD

The present invention relates to a measurement apparatus which shares a plurality of signal terminals in a plurality of operation modes, particularly to measurement apparatuses such as a signal generator having a plurality of signal processing units corresponding to respective operation modes, a waveform analysis apparatus and a signal analysis apparatus, which share a plurality of signal terminals in respective operation modes.

BACKGROUND ART

FIG. 8 is an appearance view of a conventional signal generator (hereinafter referred to as a measurement apparatus as one example) for measuring performances of various apparatuses incorporated in a data communication system and a mobile communication system or a performance of a signal transmitted in a network.

That is, in this measurement apparatus, a power switch 2, an operation panel 3 in which a large number of operation buttons, operation knobs, ten keys, function keys and the like are arranged, a display 4 having a rectangular display screen 4a, a large number of signal terminals 5, and the like are attached to a front surface 1a of a housing 1 substantially having a rectangular parallelepiped shape.

Moreover, in a test apparatus regarding data transmission, a large number of measurement functions for measuring a large number of test items with one measurement apparatus shown in FIG. 8 are incorporated in the measurement apparatus.

In general, respective measurement items (functions) in the measurement apparatus are performed by individual signal processing units for the respective measurement items (functions) incorporated in the housing 1.

An operator selects/sets an operation mode for each measurement item (function) of the measurement apparatus.

For example, for the measurement apparatus for measuring the performances of various apparatuses incorporated in the mobile communication system, the respective operation modes for sending a TDMA test signal and CDMA test signal for a TDMA system, CDMA system and other communication systems employed by the mobile communication system as a measurement object are prepared in the measurement apparatus.

Moreover, in the aforementioned measurement apparatus, there is also an operation mode for measuring output signals of various apparatuses incorporated in the mobile communication system.

Additionally, types or signal numbers of the signals inputted/outputted to the outside of the measurement apparatus differ with the respective measurement items (functions) so as to perform the respective measurement items (functions) in this type of measurement apparatus.

Therefore, essentially, in this type of measurement apparatus, for each measurement item (function), it is necessary to dispose a large number of signal terminals for exclusive use in a signal processing unit for the corresponding measurement item (function) on the front surface 1a of the housing 1.

However, as shown in FIG. 8, the operation panel 3 having a predetermined occupation area is disposed on the front surface 1a of the housing 1.

The aforementioned large number of operation buttons, operation knobs, ten keys, and function keys disposed on the operation panel 3 are essential for setting test conditions in detail.

Therefore, the occupation area of the operation panel 3 in the front surface 1a cannot be reduced any more.

Consequently, in this type of measurement apparatus, for each measurement item (function), it is difficult to arrange a plurality of signal terminals for exclusive use in the corresponding measurement item (function) on the front surface 1a of the housing 1.

To solve such disadvantage, in a conventional art, a plurality of signal terminals 5a attached to the front surface 1a of the housing 1 as shown in FIG. 9A are defined as the signal terminals 5a shared for the respective measurement items (functions).

Moreover, the shared signal terminal 5a is switched and connected to the signal processing unit for performing the measurement item (function) designated in the operation mode.

However, since the type of the signal inputted/outputted to each shared signal terminal 5a attached to the front surface 1a of the housing 1 differs with each measurement item (function), a signal name cannot be put down in the vicinity of each shared signal terminal 5a attached to the front surface 1a of the housing 1.

Additionally, as shown in FIGS. 9A and 9B, individual signal name sheets 6a, 6b, ... are prepared for the respective measurement items (functions).

Moreover, in each of the signal name sheets 6a, 6b, ..., a through hole 7 for passing the signal terminal 5a is formed in a position corresponding to the shared signal terminal 5a, and a signal name 8 is put down in a position adjacent to each through hole 7.

Furthermore, every time the operator changes the measurement item (function) in the operation mode, the operator uses, for example, a screw, and the like to attach the signal name sheet 6a, 6b, ... for the measurement item (function) designated in the operation mode to the front surface 1a of the housing 1 so that each shared signal terminal 5a is passed through the through hole 7.

The operator can use the signal name sheets 6a, 6b, ... corresponding to the respective operation modes to immediately grasp the signal name of the signal to be inputted/outputted to each shared signal terminal 5a.

However, even in the measurement apparatus in which the signal name sheets 6a, 6b, ... shown in FIGS. 9A and 9B are used to grasp the signal names of the signals to be inputted/outputted to the respective shared signal terminals 5a, the following problems yet remain to be solved.

That is, every time the operator of the measurement apparatus changes the operation mode to start measuring a new measurement item (function), the operator needs to replace the signal name sheet 6a, 6b, ... attached to the front surface 1a of the housing 1 with another signal name sheet 6a, 6b, ... corresponding to the changed measurement item (function).

A replacing operation of the signal name sheet 6a, 6b, ... is laborious. Therefore, when the measurement item (function) is frequently changed, an operation burden of the operator (measuring person) increases.

Moreover, when the number of measurement items (functions) is large, the number of signal name sheets 6a, 6b, ... also increases. Therefore, management of the signal name sheets 6a, 6b, ... becomes intricate.

Furthermore, every time the measurement item (function) is added, it is necessary to prepare the signal name sheet 6a, 6b, . . . for the added measurement item (function).

DISCLOSURE OF THE INVENTION

A measurement apparatus of the present invention is applied to a measurement apparatus in which a plurality of signal processing units for a plurality of respective operation modes concerning a signal processing are contained in a housing, and an operation panel, a display, and a plurality of signal terminals positioned in the vicinity of the display and shared by the respective signal processing units are arranged on a housing front surface.

Moreover, an object of the present invention is to provide a measurement apparatus. In the measurement apparatus, when an operator selects an operation mode, a signal name of a signal to be inputted/outputted to the shared signal terminal is automatically displayed, and operability can largely be enhanced. Even when a measurement item (function) is added, the signal name corresponding to the added measurement item (function) can easily be displayed, and the operability can further be enhanced.

To achieve the aforementioned object, according to one aspect of the present invention, there is provided a measurement apparatus comprising:

- a plurality of signal processing units (16a, 16b, 16c) contained in a housing (1) and corresponding to a plurality of operation modes concerning a signal processing, respectively;
- an operation panel (3), a display (4), and a plurality of signal terminals (5a) disposed in the vicinity of the display and shared by the respective signal processing units, which are arranged on a front surface of the housing;
- a changeover switch circuit (17a, 17b, 17c, 18a, 18b, 18c), disposed between the plurality of signal terminals and the respective signal processing units, for switching/connecting the plurality of signal terminals to the respective signal processing units;
- a signal name memory (30), disposed for each of the signal processing units, for storing a signal name of a signal allocated to the signal terminal;
- switch circuit control means (22) for changing the changeover switch circuit in response to an operated/inputted operation mode designation to connect each signal terminal to the signal processing unit corresponding to the designated operation mode; and
- signal name display means (25, 23) for reading each signal name corresponding to the designated operation mode from the signal name memory and displaying the signal name in the vicinity of the corresponding signal terminal in a display screen of the display in response to the operation mode designation.

In the measurement apparatus constituted as described above, the signal name of the signal allocated to each signal terminal is stored in the signal name memory for each signal processing unit corresponding to each operation mode.

Moreover, when the operator uses, for example, the operation panel to designate the operation mode, each signal name corresponding to the operation mode is read and displayed in the vicinity of each corresponding signal terminal in the display screen of the display.

Therefore, since the operator can only designate the operation mode corresponding to the measurement item (function) to confirm the signal name of the signal to be inputted/outputted to each shared signal terminal, operability of the measurement apparatus can largely be enhanced.

BEST MODE FOR CARRYING OUT OF THE INVENTION

One embodiment of the present invention will be described hereinafter with reference to the drawings.

Figure 1:
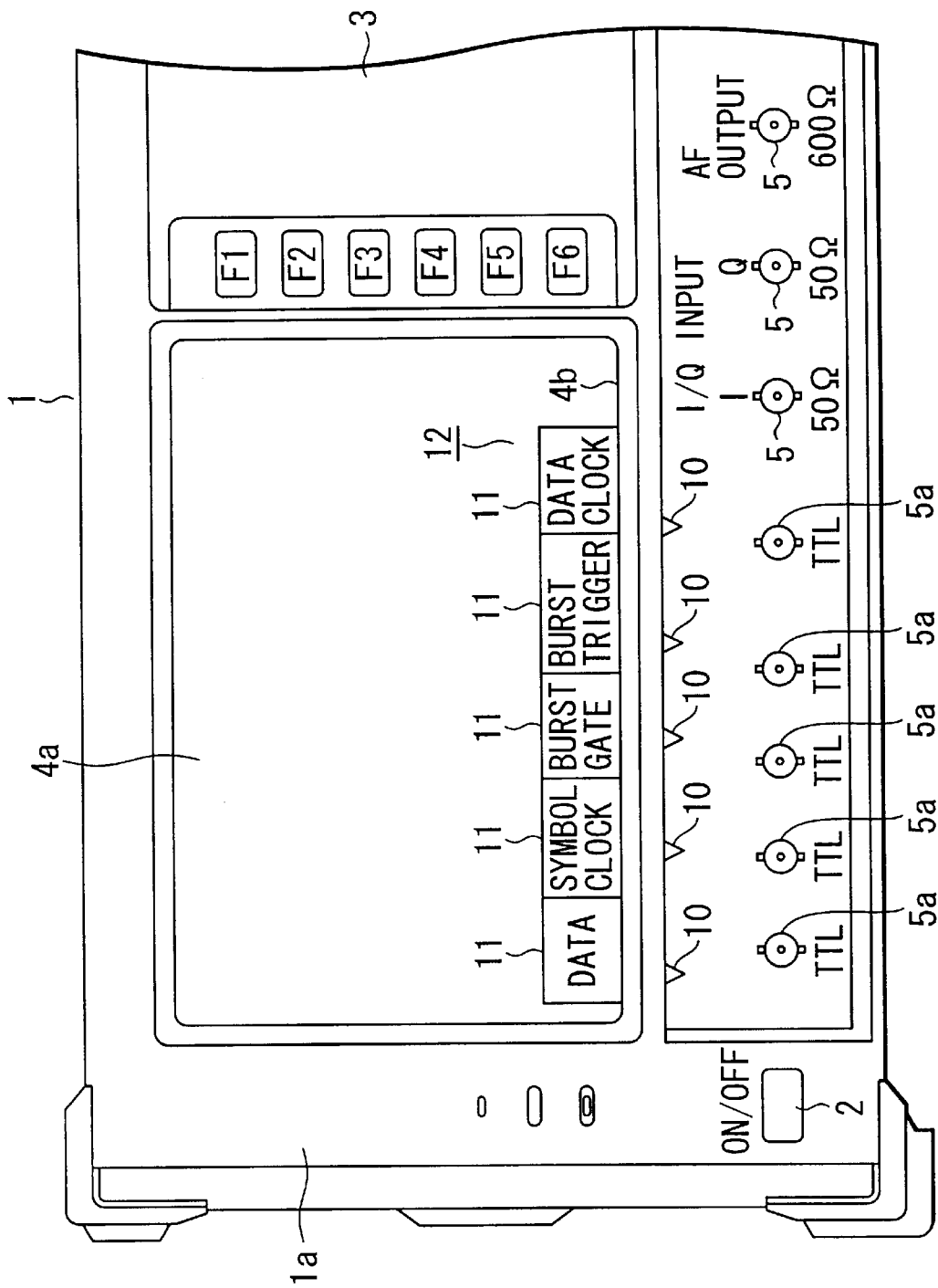
FIG. 1 is a diagram showing a part taken from a front surface of a measurement apparatus according to one embodiment of the present invention.

FIG. 1 is a front view of a measurement apparatus according to an embodiment.

The measurement apparatus has a function of a signal generator for generating and outputting various modulation signals.

Figures 6, 8:
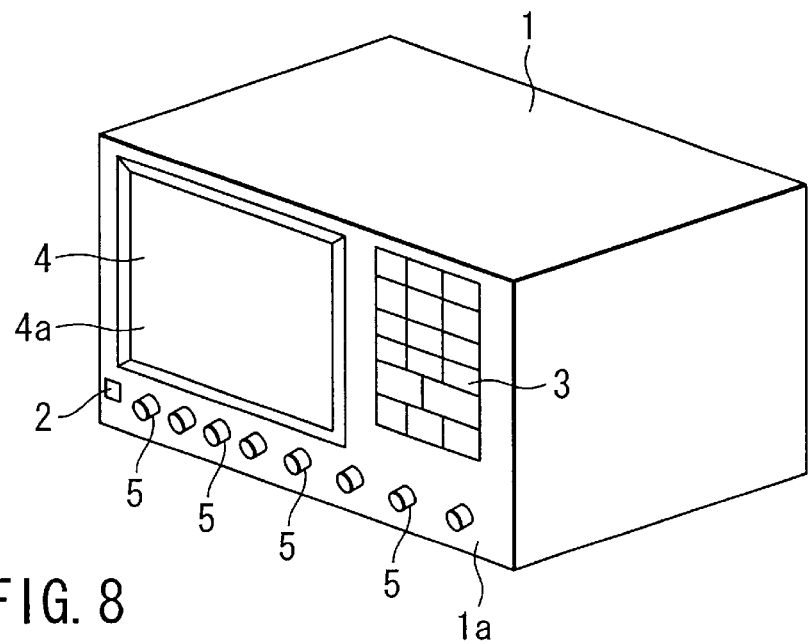
FIG. 6 is a diagram showing a stored content of a back surface (rear surface) correspondence table memory in the measurement apparatus of FIG. 1.
FIG. 8 is a perspective view showing an appearance of a conventional general measurement apparatus.
Figure 9A:
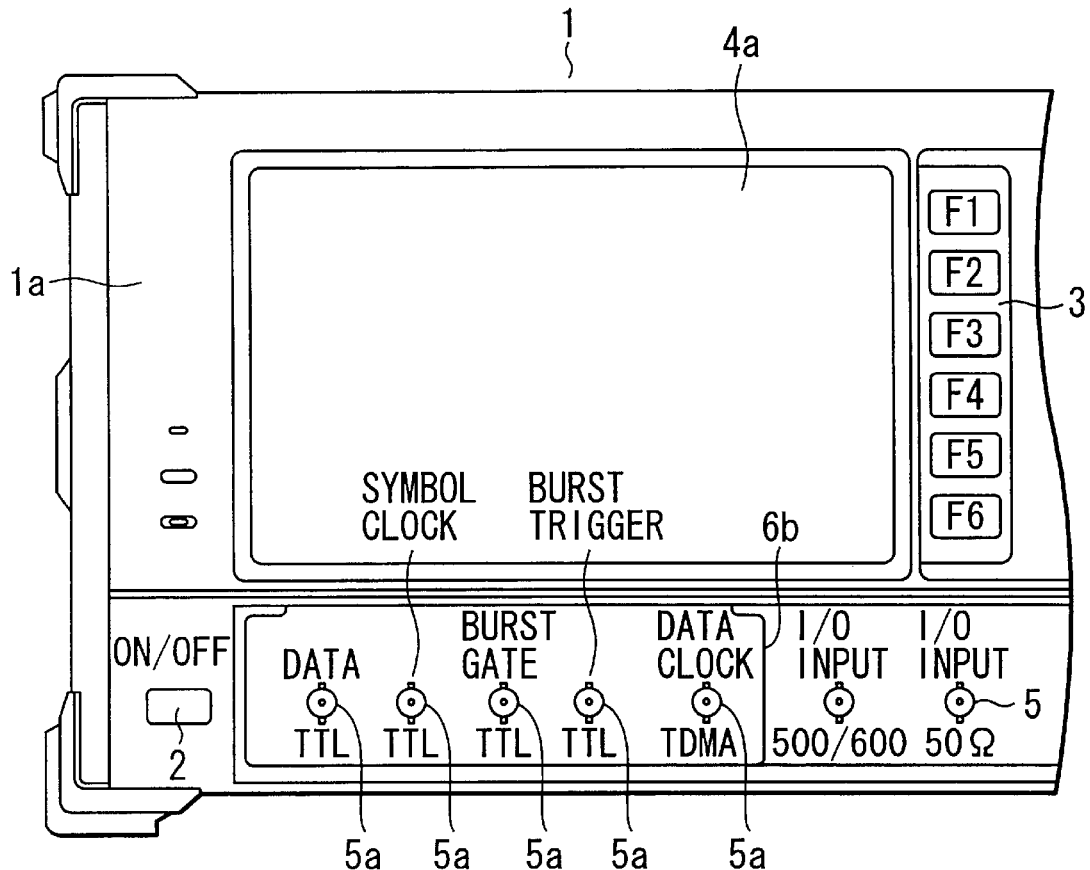
FIGS. 9A and 9B are diagrams showing a conventional technique for using a signal name sheet to inform the signal name of a shared signal terminal in the measurement apparatus in which the shared signal terminal is used.
Figure 9B:
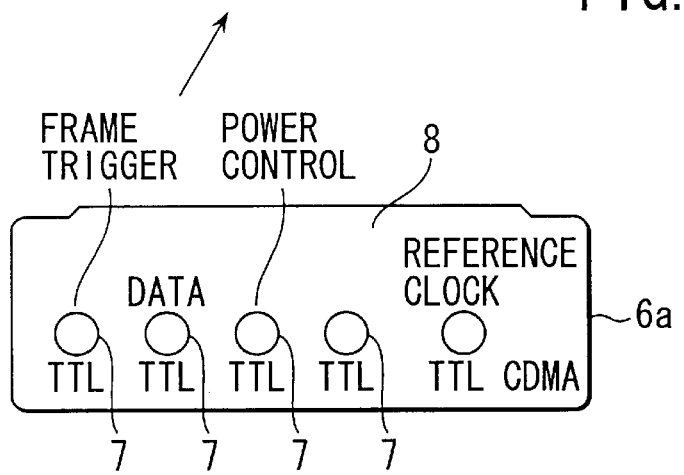

In FIG. 1, the same part as that of the conventional measurement apparatus shown in FIG. 8 and FIG. 9A is denoted with the same reference numerals, and detailed description of the overlapped part is omitted.

In a measurement apparatus according to one embodiment of the present invention, a power switch 2, a display 4 having a rectangular display screen 4a, five shared signal terminals 5a, and a plurality of signal terminals 5 in which signals to be inputted/outputted are fixed are disposed on a front surface 1a of a housing 1.

The five shared signal terminals 5a are disposed at equal intervals in the vicinity of a lower side 4b of the display screen 4a of the display 4 and along the lower side 4b.

Furthermore, arrow markers 10 are put down in contact with the lower side 4b of the display screen 4a in the front surface 1a and in positions opposite to the respective shared signal terminals 5a.

Moreover, a display TTL indicating that levels of digital input signals applied to these five shared signal terminals 5a should be applied as the same level of TTL is attached below the attachment positions of the five shared signal terminals 5a.

Furthermore, a signal name pattern 12 constituted of a plurality of frames in which respective signal names 11 of the signals allocated to the respective signal terminals 5a are written is displayed in a position opposite to the respective shared signal terminals 5a in the lower side 4b of the display screen 4a of the display 4.

For the signal name pattern 12, in an example shown in FIG. 1, "data", "symbol clock", "burst gate", "burst trigger", and "data clock" are allocated as the signal names 11 to the corresponding signal terminals 5a in order from the left side of the drawing.

Figure 2:
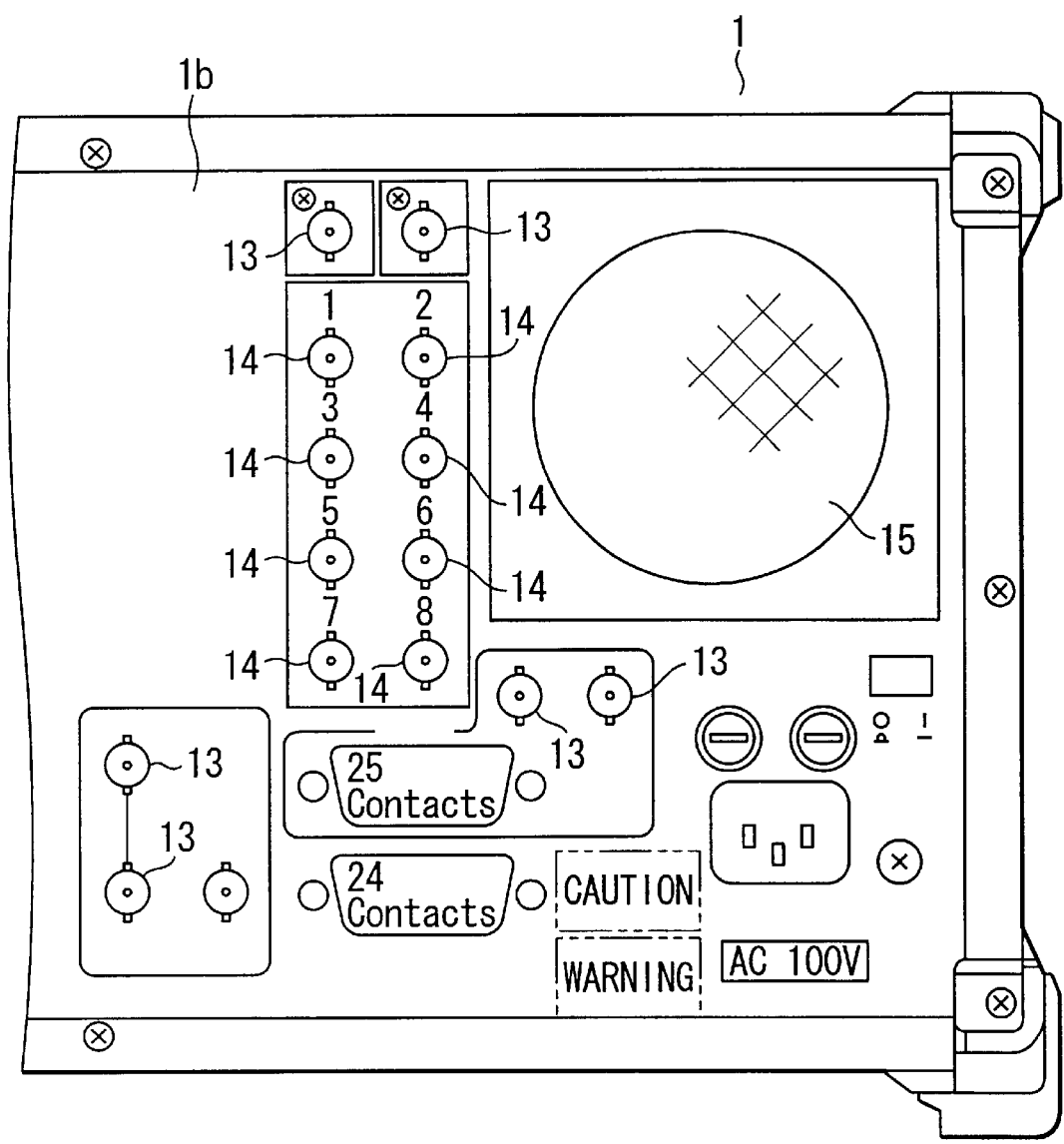
FIG. 2 is a diagram showing a part taken from the back surface of the measurement apparatus of FIG. 1.

FIG. 2 is a diagram of the measurement apparatus of FIG. 1 seen from a back surface side.

Similarly as the front surface 1a of the housing 1, in a back surface 1b of the housing 1, a plurality of signal terminals 13 in which the signals to be inputted/outputted are fixed, a plurality of shared signal terminals 14 different in the inputted/outputted signal with each operation mode, a cooling fan 15, and the like are disposed.

Additionally, it is assumed that the respective shared signal terminals 14 attached to the back surface 1b have a very small frequency for use as compared with the respective shared signal terminals 5a attached to the front surface 1a.

Figure 3:
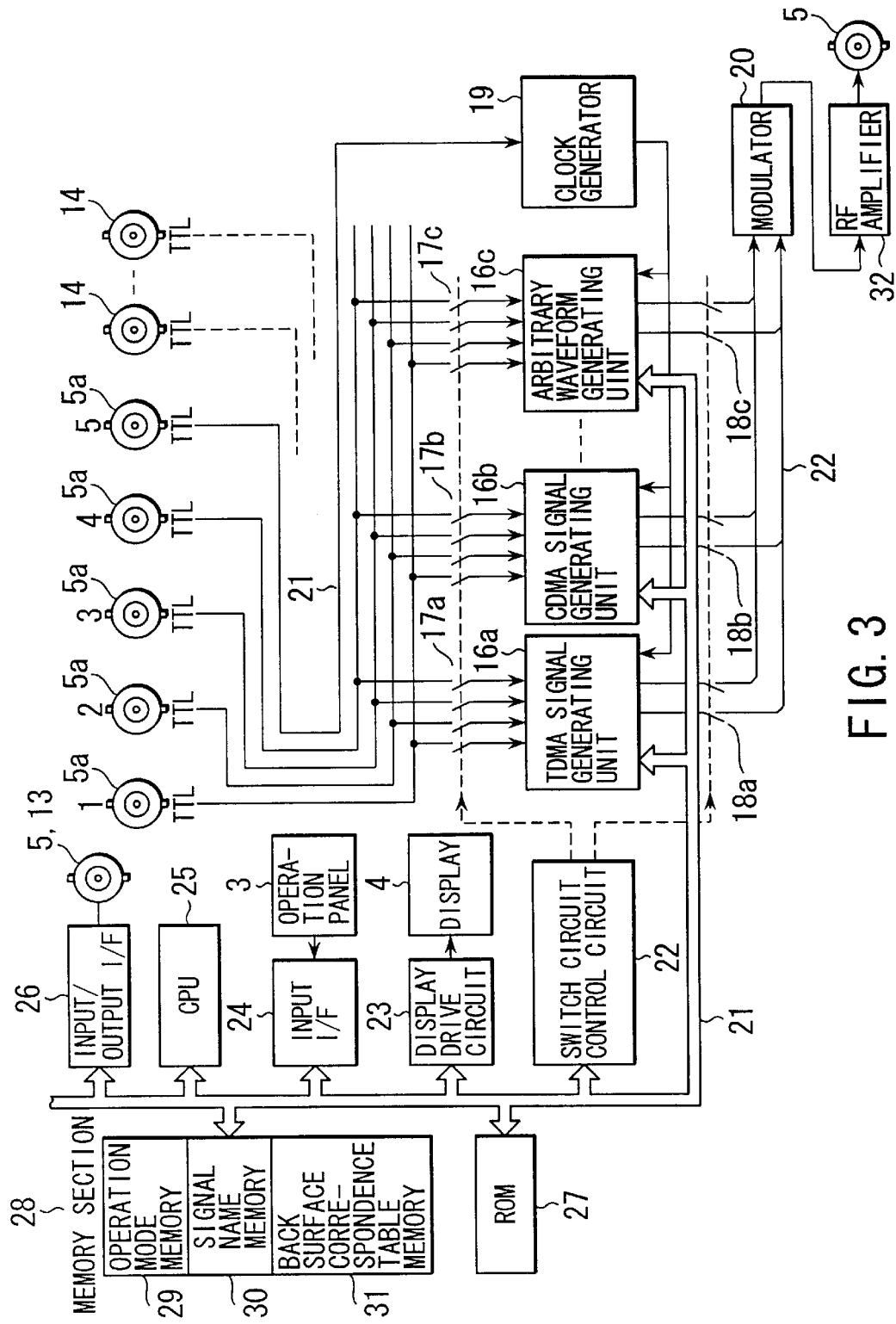
FIG. 3 is a block diagram showing a schematic constitution of the measurement apparatus of FIG. 1.

Moreover, the display TTL indicating that the level of the digital input signal to be applied to the shared signal terminal 14 should also be applied as the same level of TTL is attached (see FIG. 3).

FIG. 3 is a block diagram showing a schematic inner connection constitution of the measurement apparatus of FIG. 1.

A plurality of signal processing units corresponding to the respective operation modes are incorporated in the measurement apparatus of the embodiment.

That is, as shown in FIG. 3, a plurality of signal generating units for generating signals for a test, such as a TDMA signal generating unit 16a for generating a TDMA signal for the test, a CDMA signal generating unit 16b for generating a CDMA signal for the test, and an arbitrary signal generating unit 16c are incorporated.

The respective signal generating units 16a, 16b, 16c are connected to the aforementioned respective shared signal terminals 5a via switches 17a, 17b, 17c and signal conductor 21 as a changeover switch circuit.

Furthermore, the respective signal generating units 16a, 16b, 16c are connected to a modulator 20 via switches 18a, 18b, 18c and signal conductor 22, respectively.

The signals for the test outputted from the respective signal generating units 16a, 16b, 16c are modulated by the modulator 20, and subsequently amplified by an RF (high frequency) amplifier 32.

The signal for the test amplified by the RF (high frequency) amplifier 32 is outputted to the outside of the apparatus as a test object via the signal terminal 5 which is disposed on the front surface 1a and whose signal is fixed.

A clock generator 19 connected to the fifth shared signal terminal 5a (Number 5) among the five shared signal terminals 5a of Number 1 to 5 generates a clock signal synchronized with a clock inputted via the fifth shared signal terminal 5a, and supplies the clock signal to the respective signal generating units 16a, 16b, 16c.

Additionally, as shown and partially omitted via a broken line in FIG. 3, the respective signal generating units 16a, 16b, 16c are also attached to the respective shared signal terminals 14 attached to the back surface 1b of the housing 1 via the respective switches.

In the measurement apparatus constituted of a type of computer, a bus line 21 is connected to the aforementioned signal generating units 16a, 16b, 16c, a switch circuit control circuit 22 for changing/controlling respective switches 17a, 17b, 17c, 18a, 18b, 18c, a display drive circuit 23 for displaying various data in the display 4, an input interface 24 to which various types of operation information are inputted via the operation panel 3, a CPU 25, and an input/output interface 26 to which various signals are inputted/outputted via the signal terminals 5, 13.

Furthermore, a ROM 27 for storing a control program for the CPU 25 and a storage section 28 are connected to the bus line 21.

In the storage section 28, an operation mode memory 29 for storing the operation mode set at the present time, signal name memory 30 and back surface (rear surface) correspondence table memory 31 are formed.

Figure 4:
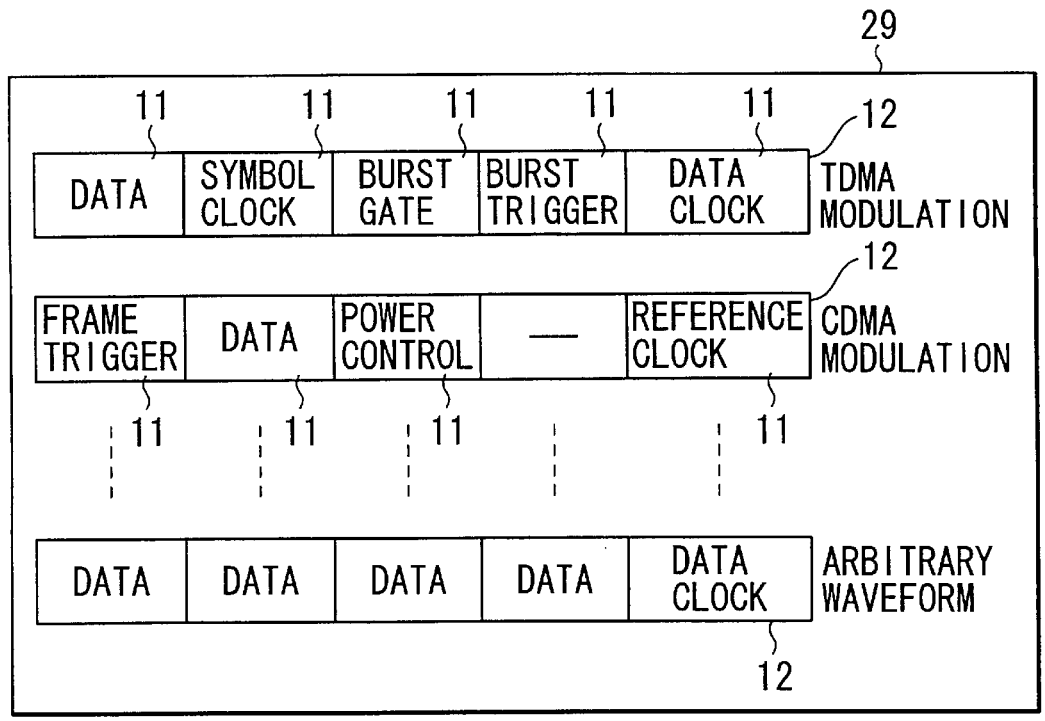
FIG. 4 is a diagram showing a stored content of a signal name memory in the measurement apparatus of FIG. 1.

In the signal name memory 30, as shown in FIG. 4, a signal name pattern 12 constituted of a plurality of frames in which signal names 11 of the signals allocated to the respective signal terminals 5a are written is stored for each of the respective signal generating units 16a, 16b, 16c.

For example, for the top TDMA signal generating unit 16a, "data", "symbol clock", "burst gate", "burst trigger", and "data clock" are set as the signal names 11 to the respective signal terminals 5a of numbers 1 to 5.

Similarly, for the second CDMA signal generating unit 16b, "frame trigger", "data", "power control", and "reference data clock" are set for the respective signal terminals 5a of numbers 1 to 3 and 5.

Additionally, in this case, the fourth signal terminal 5a is in an unused state.

Moreover, data of a content corresponding to a back surface correspondence table 31a shown in FIG. 6 is stored in a table form in the back surface (rear surface) correspondence table memory 31.

In the back surface correspondence table 31a, the signal names 11 allocated to the respective shared signal terminals 14 (terminal numbers) attached to the back surface 1b shown in FIG. 2 are prepared for each of the respective signal generating units 16a, 16b, 16c.

Moreover, the switch circuit control circuit 22 closes the respective switches on opposite sides of the signal generating unit, and opens the respective switches on the opposite sides of another signal generating unit based on a signal generating unit change instruction in which one of the signal generating units 16a, 16b, 16c of the CPU 25 is designated. In this case, only the designated signal generating unit is connected to the RF amplifier 32 via the respective shared signal terminals 5a and modulator 20.

Figure 7:
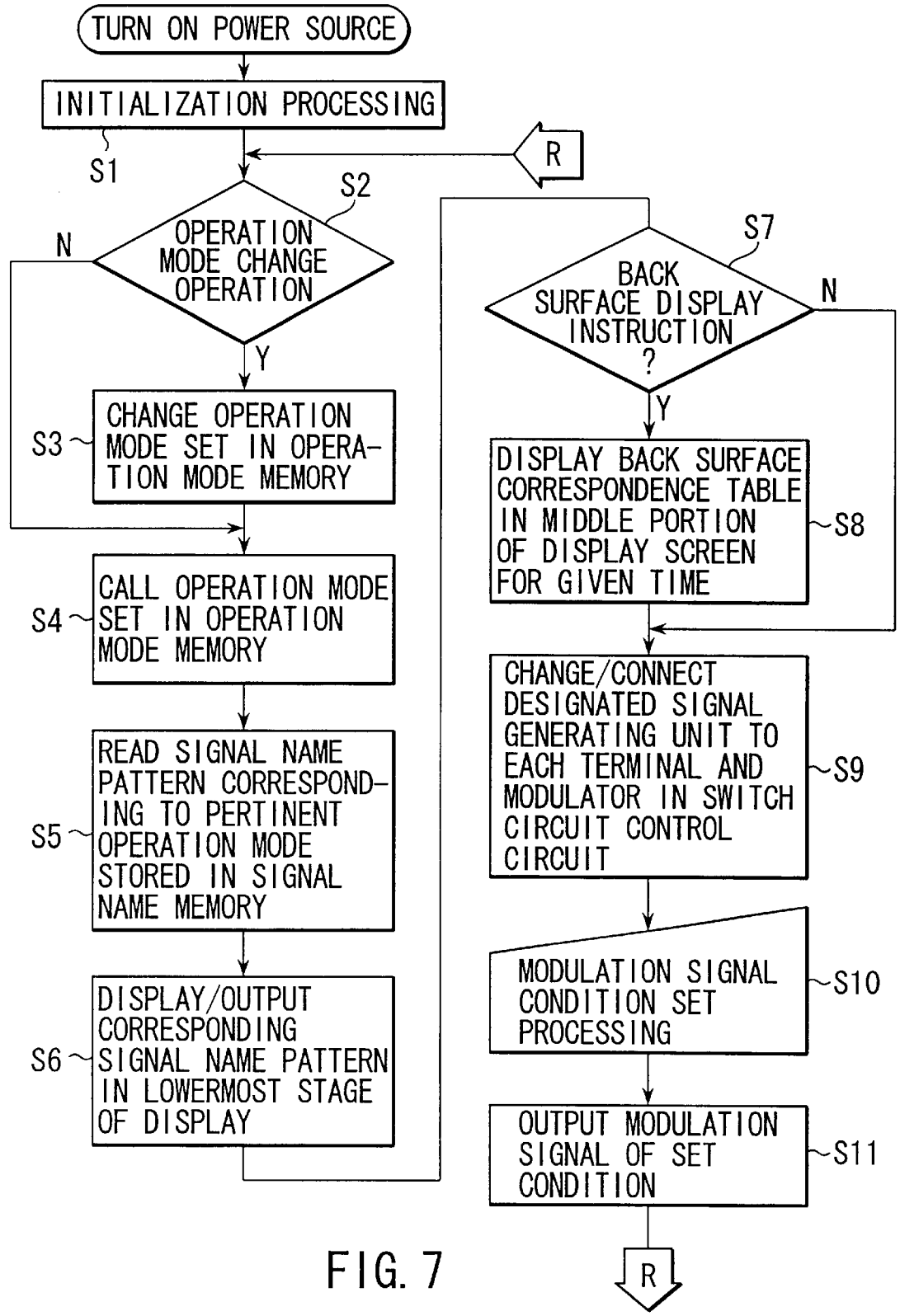
FIG. 7 is a flowchart showing a display processing operation of a signal name in the measurement apparatus of FIG. 1.

Furthermore, the CPU 25 is constituted to execute a necessary processing in a procedure in accordance with a flowchart shown in FIG. 7 based on the control program stored in the ROM 27, when a power is supplied to the measurement apparatus.

That is, as shown in FIG. 7, first when the power switch 2 of the front surface 1a is turned on, the CPU 25 performs various initialization processings (step S1).

Moreover, the operation panel 3 is in a standby state until the operator operates the panel.

When an operator's operation content is an operation mode change operation (step S2), the CPU 25 sets the changed operation mode in the operation mode memory 29 of the storage section 28 (step S3).

Subsequently, also when the operator's operation content is not the operation mode change in the step S2, the CPU 25 reads the operation mode stored in the operation mode memory 29 (step S4).

Figure 5:
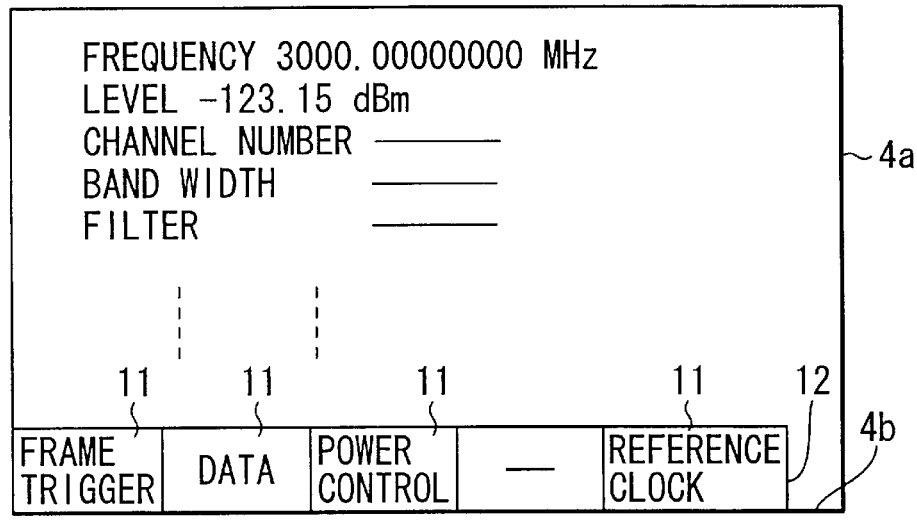
FIG. 5 is a diagram showing a displayed content in a display of the measurement apparatus of FIG. 1.

Subsequently, the CPU 25 reads the signal name pattern 12 of the signal generating unit 16a, 16b, 16c corresponding to the pertinent operation mode stored in the signal name memory 30 (step S5). Subsequently, the CPU 25 drives the display drive circuit 23 to display the read signal name pattern 12 in contact with the lower side 4b of the lowermost stage of the display screen 4a of the display 4 as shown in FIG. 5 (step S6).

Additionally, a display state of the signal name pattern 12 is maintained without being deleted while the measurement apparatus is operating.

Therefore, in this state, as shown in FIG. 1, each signal name 11 in the signal name pattern 12 indicates the signal name of the signal inputted/outputted to each shared signal terminal 5a disposed adjacent to the lower side 4b of the display screen 4a.

Subsequently, when the operator's operation content is a back surface terminal display instruction (step S7), the CPU 25 reads the back surface correspondence table 31a stored in the back surface (rear surface) correspondence table memory 31 of the storage section 28 and shown in FIG. 6 to display the table in a middle portion of the display screen 4a for a given time such as one minute (step S8).

Therefore, the operator can confirm the signal name of the signal inputted/outputted to the shared signal terminal 14 attached to the back surface 1b from a front surface 1a side.

Subsequently, the CPU 25 drives the switch circuit control circuit 22 to connect the signal generating units 16a, 16b, 16c designated in the operation mode to the respective signal terminals 5a, and switches/connects the units to the modulator 20 (step S9).

Subsequently, the operator connects the necessary signal conductor to the respective shared signal terminals 5a, 14, and subsequently uses the operation panel 3 to set various conditions of a modulation signal generated by the designated signal generating unit 16a, 16b, or 16c (step S10).

Examples of the conditions include a frequency, level, channel number, band width, filter, and the like as shown in FIG. 5.

After the condition setting is finished, the modulation signal for the test in the designated conditions is generated by the designated signal generating unit 16a, 16b, or 16c, and outputted to the signal terminal 5 via the modulator 20 and RF amplifier 32 (step S11).

In the measurement apparatus constituted as described above, as shown in FIG. 4, the signal name pattern 12 in which the signal names 11 of the signals allocated to the respective shared signal terminals 5a attached to the front surface 1a of the housing 1 are written in the frames is stored in the signal name memory 29 of the storage section 28 for each of the signal generating units 16a, 16b, 16c corresponding to the respective operation modes.

Subsequently, for example, when the operator of the measurement apparatus uses the operation panel 3 to designate the operation mode, the signal name pattern 12 corresponding to the operation mode is read, and displayed along the lower side 4b of the display screen 4a of the display 4 as shown in FIG. 1.

As a result, each signal name 11 of the signal name pattern 12 indicates the signal name of the signal to be inputted/outputted to the shared signal terminal 5a attached below the lower side 4b of the display screen 4a.

Therefore, when the operator only designates the operation mode corresponding to the measurement item (function) indicating each of the signal generating units 16a, 16b, 16c, the operator can confirm the signal name 11 of the signal to be inputted/outputted to each shared signal terminal 5a, and the operability of the measurement apparatus can remarkably be enhanced.

That is, different from the conventional apparatus, it is unnecessary to prepare the signal name plate 6a, 6b, ... for each signal generating unit.

Furthermore, even when the measurement item (signal generating units 16a, 16b, 16c) is added, the signal name 11 corresponding to the signal generating unit added to the shared signal terminal 5a can be displayed only by setting the signal name pattern 12 with the respective signal names 11 corresponding to the added signal generating units written therein in the signal name memory 30.

Therefore, as described above, according to the present invention, when the operator selects the operation mode, the signal name of the signal to be inputted/outputted to the shared signal terminal is automatically displayed, and the operability can largely be enhanced. Additionally, even when the measurement item (function) is added, the signal name corresponding to the added measurement item (function) can easily be displayed. Therefore, the measurement apparatus whose operability can further be enhanced can be provided.

What is claimed is:

1. A measurement apparatus comprising:
    a plurality of signal processing units contained in a housing and corresponding to a plurality of operation modes concerning a signal processing, respectively;
    an operation panel, a display, and a plurality of signal terminals disposed in the vicinity of the display and shared by said respective signal processing units, which are arranged on a front surface of said housing, respectively;
    a changeover switch circuit, disposed between said plurality of signal terminals and said respective signal processing units, for switching/connecting said plurality of signal terminals to said respective signal processing units;
    a signal name memory, disposed for each of said signal processing units, for storing a signal name of a signal allocated to each of said signal terminals;
    switch circuit control means for switching said changeover switch circuit in response to an operated/inputted operation mode designation to connect said each signal terminal to the signal processing unit corresponding to the designated operation mode; and
    signal name display means for reading each signal name corresponding to said designated operation mode from said signal name memory and displaying the signal name in the vicinity of the corresponding signal terminal in a display screen of said display in response to said operation mode designation.

2. The measurement apparatus according to claim 1, wherein a display state of said signal name is maintained without being deleted for a period for which the measurement apparatus is operating.

3. The measurement apparatus according to claim 1, wherein a plurality of markers are put down in contact with a lower side of the display screen of said display in said housing front surface, and in positions corresponding to said plurality of signal terminals.

4. The measurement apparatus according to claim 1, wherein a display indicating that levels of input signals applied to the respective signal terminals should be applied as the same level is attached to attachment positions of said plurality of signal terminals in said housing front surface.

5. The measurement apparatus according to claim 1, further comprising a back surface correspondence memory in which a plurality of signal terminals shared by said respective signal processing units attached to a back surface of the housing, and signal names allocated to the respective shared signal terminals are prepared, wherein said signal name display means reads the signal names allocated to the plurality of signal terminals attached to said housing back surface from said back surface correspondence memory in response to a back surface terminal display instruction and displays the signal names in the display screen of said display.

6. The measurement apparatus according to claim 5, wherein said signal name display means reads the signal names allocated to the plurality of signal terminals attached to said housing back surface and displays the signal names in a table form in the display screen of said display for a predetermined time.

7. The measurement apparatus according to claim 5, wherein a display indicating that levels of input signals applied to the respective signal terminals should be applied as the same level is attached to attachment positions of said plurality of signal terminals in said housing back surface.

8. The measurement apparatus according to claim 1, wherein said plurality of signal processing units comprise a TDMA signal generating unit for generating a TDMA signal for a test, and a CDMA signal generating unit for generating a CDMA signal for the test.

9. The measurement apparatus according to claim 8, wherein for said TDMA signal generating unit, said signal name display means displays "data", "symbol clock", "burst gate", "burst trigger", and "data clock" as the signal names for the respective signal terminals in the display screen of said display.

10. The measurement apparatus according to claim 8, wherein for said CDMA signal generating unit, said signal name display means displays "frame trigger", "data", "power control", and "reference data clock" as the signal names for the respective signal terminals in the display screen of said display.

* * * * *